(12) United States Patent
Jochym et al.

(10) Patent No.: US 6,842,879 B1
(45) Date of Patent: Jan. 11, 2005

US006842879B1

(54) METHODS AND APPARATUS FOR FACILITATING THE DESIGN OF AN ADAPTER CARD OF A COMPUTER SYSTEM

(75) Inventors: Daniel A. Jochym, Dowingtown, PA (US); Rama Rao V. Voddi, Chester Springs, PA (US)

(73) Assignee: Unisys Corporation, Blue Bell, PA (US)

( * ) Notice: Subject to any disclaimer, the term of this patent is extended or adjusted under 35 U.S.C. 154(b) by 988 days.

(21) Appl. No.: 09/717,963

(22) Filed: Nov. 21, 2000

(51) Int. Cl.⁷ .......................... G06F 17/50; G06F 9/45
(52) U.S. Cl. .................................. 716/1; 716/4; 703/13
(58) Field of Search ........................... 716/1, 4; 703/13

(56) References Cited

U.S. PATENT DOCUMENTS

| | | | |
|---|---|---|---|
| 3,733,587 A | 5/1973 | Lloyd et al. | 340/172.5 |
| 3,932,843 A | 1/1976 | Trelut et al. | 340/172.5 |
| 4,125,763 A | 11/1978 | Drabing et al. | 235/302 |
| 4,455,654 A | 6/1984 | Bhaskar et al. | 371/20 |
| 4,590,581 A | 5/1986 | Widdoes, Jr. | 364/578 |
| 4,644,487 A | 2/1987 | Smith | 364/578 |
| 4,901,259 A | 2/1990 | Watkins | 364/578 |
| 4,985,893 A | 1/1991 | Gierke | 371/16.2 |
| 5,339,262 A | 8/1994 | Rostoker et al. | 364/578 |
| 5,546,562 A | 8/1996 | Patel | 395/500 |
| 5,581,695 A | 12/1996 | Knoke et al. | 395/183.04 |
| 5,793,945 A | 8/1998 | Tabata et al. | 395/183.01 |
| 5,978,937 A | 11/1999 | Miyamori et al. | 714/45 |

Primary Examiner—Leigh M. Garbowski
(74) Attorney, Agent, or Firm—Lise A. Rode; Mark T. Starr; Woodcock Washburn

(57) ABSTRACT

A printed circuit board adapted for prototyping comprises a processor module, a section reserved for an I/O module to be added at a later time, a first and a second connector, a bridge circuit and a secondary bus. The secondary bus provides a communication path between the processor module and I/O module that is to be added at a later time. The second connector is coupled to the secondary bus to enable a separate I/O card to be connected to the printed circuit board and to serve temporarily as the I/O module of the board. This permits prototyping in the absence of an I/O module in the second portion of the board.

11 Claims, 2 Drawing Sheets

---

210
providing on the adapter card being prototyped a bridge circuit in communication with the first connector of the adapter card to bridge the primary bus of the computer system to a secondary bus on the PCB, the secondary bus adapted to provide a communication path between the processor module and the I/O module

220
providing on the adapter card a second connector in communication with the secondary PCI bus to enable a separate I/O card to be connected to the adapter to serve temporarily as the I/O module of the card to permit prototyping of the module in the absence of an I/O module in the first section of the adapter card being prototyped

230
connecting a separate I/O card to the second connector

240
operating the adapter card being prototyped with the separate I/O card serving temporarily as the I/O module of the card to test the functionality of the card

250
removing the separate I/O module from the second connector when testing the functionality of the adapter card is completed

260
implementing a permanent I/O module in the first section of the adapter card and removing the second connector from the card, the resulting adapter card comprising a production version of the card

METHODS AND APPARATUS FOR FACILITATING THE DESIGN OF AN ADAPTER CARD OF A COMPUTER SYSTEM

FIELD OF THE INVENTION

This invention relates to apparatus and methods for designing adapter cards for computer systems.

BACKGROUND

Many types of adapter cards for computer systems, including high performance I/O cards, consist of two sections, an I/O interface section and a processor section. The I/O interface section usually implements an industry standard I/O interface, such as, for example, the Small Computer Systems Interface (SCSI), the Asynchronous Transfer Mode (ATM) interface, the Fibre Channel interface, the Universal Serial Bus interface, the IEEE 1394 interface, the Ethernet and other common network interfaces, and other well known I/O interfaces. The processor section typically adds intelligence to the adapter card and enables it to perform capabilities not usually found in adapter cards based solely on an industry standard interface. A typical processor section often comprises a processor, memory, control logic, and maintenance logic. These components may or may not also be industry standard or off-the-shelf components. The processor section typically executes proprietary program code that defines the added capabilities of the card. The software is usually stored within a non-volatile storage medium on the card, such as a read only memory (ROM) or the like.

Developing high performance computer I/O cards in today's swiftly changing marketplace is a challenging task, particularly where time to market is critical. Designing a high performance adapter card having separate I/O and processor sections is particularly difficult because one section usually cannot be tested without the other section. Thus, for example, a delay in the design of the I/O section may hold up testing and debugging of the software and hardware of the processor section. Another difficulty in designing a high performance adapter card of this type is that the I/O sections are typically implemented using chipsets of other manufacturers. Delay in the planned release of a new chipset by one of these manufacturers may again hold up the design and testing of the processor section of a card. The dependence of the I/O and processor sections on each other also makes it difficult to test the processor section with different types of I/O interfaces and with chipsets from different manufacturers.

Consequently, a need exists for methods and apparatus that facilitate the design, testing, and debugging of high performance adapter cards having separate I/O and processor sections. The present invention satisfies this need.

SUMMARY OF THE INVENTION

The present invention enables the design and debug of both the I/O and processor sections of an adapter card to be coordinated. The invention allows a manufacturer to debug the processor module of an adapter card using a secondary PCI connector until the final design of the I/O module is completed. The present invention is embodied in the form of a printed circuit board adapted for prototyping. The present invention also encompasses a method of using the printed circuit board.

According to the present invention, a printed circuit board adapted for prototyping comprises a processor module, a section reserved for an I/O module to be added at a later time, a first and a second connector, a bridge circuit and a secondary bus. The processor module is designed on a first portion of the printed circuit board and a second portion of the board is reserved for an input/output (I/O) module to be added at a later time. The first connector enables the card to be connected to a primary bus of a computer system. The bridge circuit bridges the primary bus of the computer system to a secondary bus on the printed circuit board. The secondary bus provides a communication path between the processor module and the I/O module that is to be added at a later time. The second connector is coupled to the secondary bus to enable a separate I/O card to be connected to the printed circuit board and to serve temporarily as the I/O module of the board. This permits prototyping in the absence of an I/O module in the second portion of the board.

BRIEF DESCRIPTION OF THE DRAWINGS

The foregoing summary, as well as the following detailed description of the preferred embodiments, is better understood when read in conjunction with the attached drawings. For the purpose of illustrating the invention, there is shown in the drawings embodiments that are presently preferred, it being understood, however, that the invention is not limited to the specific apparatus, system, and instrumentalities disclosed. In the drawings.

DETAILED DESCRIPTION OF THE INVENTION

Figure 1:
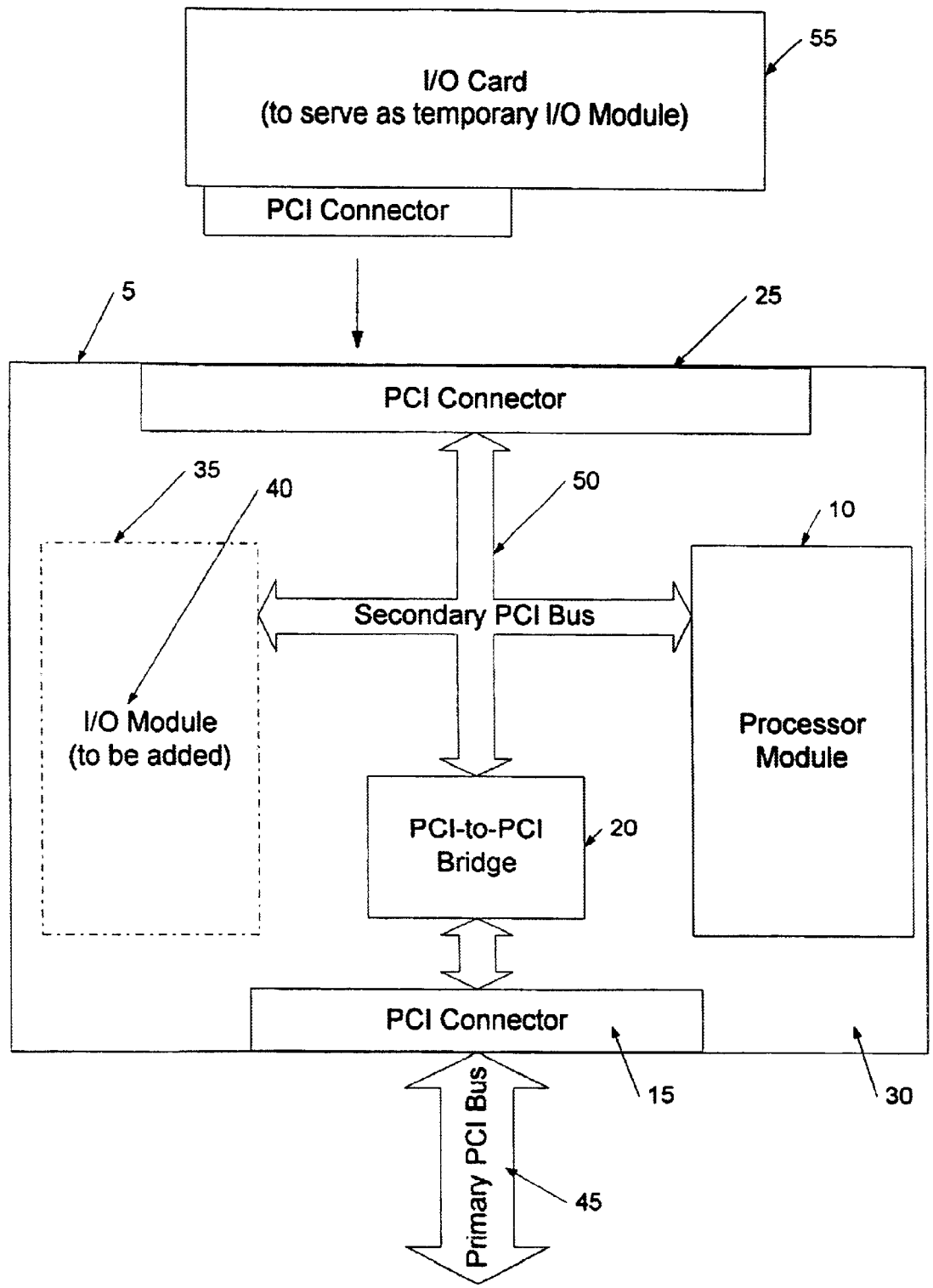
FIG. 1 is a block diagram of an adapter card according to an embodiment of the present invention.

Referring to the drawings wherein like numerals represent like elements throughout, there is shown in FIG. 1 a printed circuit board 5 adapted for prototyping. The printed circuit board 5 comprises a processor module 10, a first connector 15, a bridge circuit 20, a secondary bus 50 and a second connector 25. In the preferred embodiment, the first 15 and second 25 connectors, the secondary bus 50, and the bridge circuit 20 are implemented in accordance with the Peripheral Component Interconnect (PCI) architecture.

The processor module 10 is designed on a first portion 30 of the printed circuit board 5. The processor module 10 may perform a variety of functions, such as serving as a data router between an I/O module 40 and a computer system (not shown) in which the printed circuit board will be inserted. The processor module 10 may comprise a Field Programmable Gate Array (FPGA) that implements program code to be executed by the processor module 10. Alternatively, the processor module may be implemented by discrete components. For example, the processor module may comprise a microprocessor, such as the i960 processor available from Intel corporation, together associated memory and control circuitry. The processor module 10 can receive instructions in many ways, such as, for example, from a Read Only Memory (ROM) on the printed circuit board or from the main computer system or another intelligent system without departing from the principles of the present invention.

A second portion 35 of the board is reserved for an input/output (I/O) module 40 to be added at a later time. For example, the board designer may not have completed the design of, or settled on a particular chipset for the I/O module.

The first connector 15 provides connection of the board 5 to a primary bus 45 of a computer system (not shown). In the preferred embodiment, the primary bus 45 of the computer system implements the PCI bus architecture. The bridge circuit 20 bridges the primary bus 45 of the computer system to a secondary bus 50 on the printed circuit board 5. The secondary bus 50 provides a communication path between the processor module 10 and the I/O module 40 that is to be added at a later time.

The second connector 25 is coupled to the secondary bus 50 to enable a separate I/O card 55 to be connected to the printed circuit board 5 and to serve temporarily as the I/O module of the board 5. The temporary 110 module 55 permits prototyping of the processor module 10 in the absence of a permanent I/O module 40 in the second portion 35 of the board.

In a preferred embodiment, the second connector 25 comprises a straddle mount connector disposed on an upper edge of the adapter card 5. Various connectors, such as, for example, right angle or surface mount connectors can be used to implement the second connector without departing from the principles of the present invention.

Figure 2:
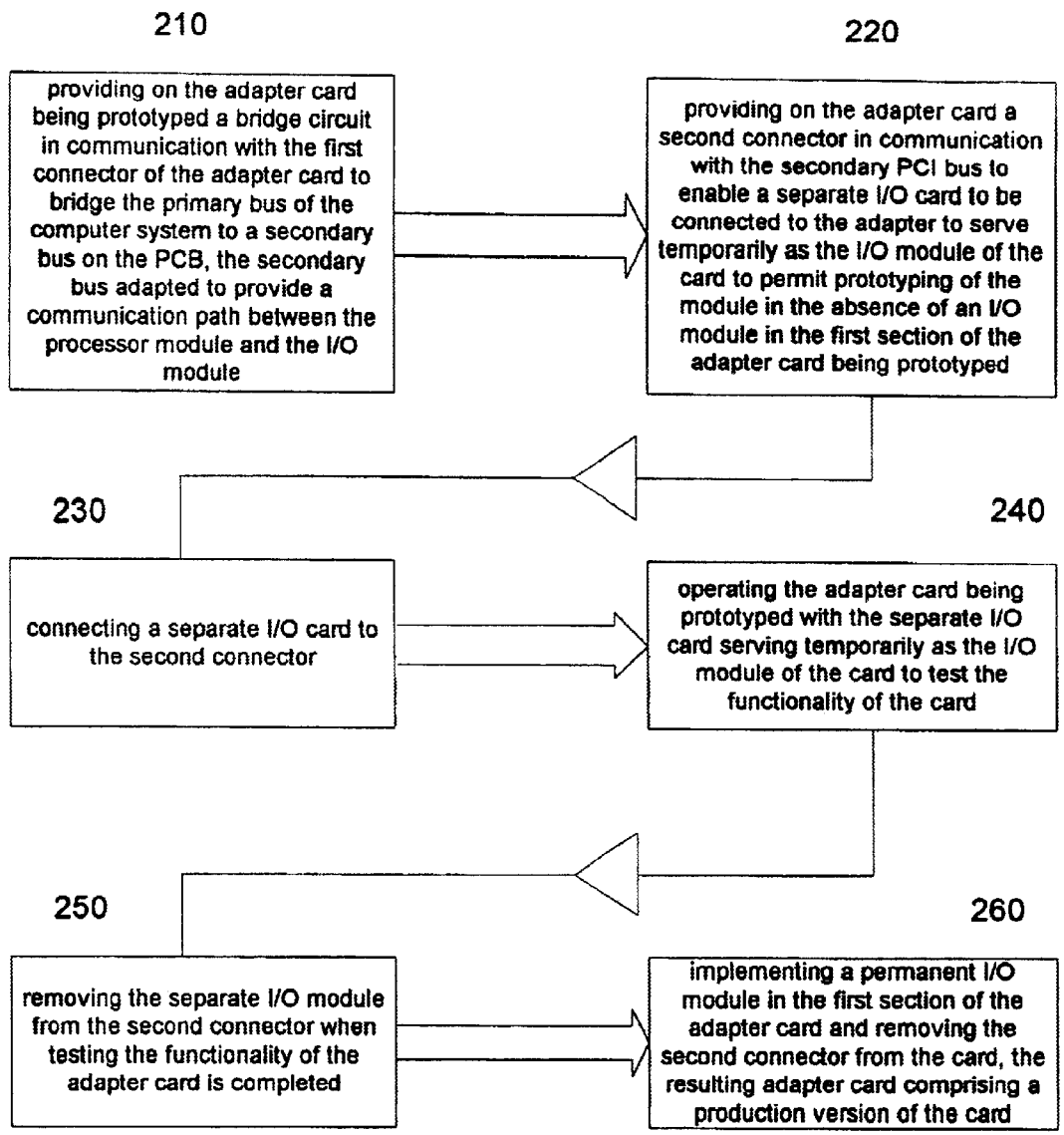
FIG. 2 is a flowchart that shows a method of making and prototyping an adapter card according to a preferred embodiment of the present invention.

FIG. 2 is a flow diagram of a method of designing an adapter card in accordance with the present invention. The method allows the processor and the I/O sections of an adapter card to be tested separately.

First, in step 210, a bridge circuit in communication with a first connector of the adapter card is provided on the adapter card under design. The bridge circuit bridges the primary bus of the computer system to a secondary bus on the printed circuit board. The secondary bus is adapted to provide a communication path between the processor module and the I/O module.

Next, in step 220, a second connector in communication with the secondary PCI bus is provided on the adapter card to enable a separate I/O card to be connected to the adapter card and to serve temporarily as the I/O module of the card. The second connector and the secondary PCI bus permit prototyping of the processor module in the absence of an I/O module in the second section of the adapter card under design.

At step 230, a separate I/O card is connected to the second connector and at step 240, the user then operates the adapter card being prototyped with the separate I/O card serving temporarily as the I/O module of the card to test the functionality of the card.

Furthermore, the adapter card, according to the present invention, can be used in another capacity. The secondary connector can be used to test various I/O modules to determine bow each module affects the functionality of the adapter card. Different 10 modules can include chipsets from various vendors or an entire module. In this respect, various I/O modules or chipsets are connected to the secondary connector and tested to see which I/O module performs most effectively with the adapter card. When one particular I/O module has been selected as the most effective, that I/O module can be permanently implemented in the second section of the adapter card.

Referring again to FIG. 2, in step 250, the separate 110 module is removed from the second connector when testing of the functionality of the adapter card is completed. Then, in step 260, a permanent I/O module is implemented in the second section of the adapter card and the second connector may be removed from the design. The second connector, however, does not need to be removed from the design, it can, for example, be left in place as a debugging port or the like. The resulting design is then used to produce the final end product.

As the foregoing illustrates, the present invention is directed to an apparatus and methods for designing adapter cards for computer systems, including without limitation high performance computer input/output (I/O) cards. It is understood that changes may be made to the embodiments described above without departing from the broad inventive concepts thereof. For example, the second connector may not be a straddle mount but a right angle or surface mount connector. Additionally, various components may not need to comply with PCI architecture. Therefore, the spirit and scope of the appended claims should not be limited to the description of the preferred embodiment contained herein.

What is claimed is:

1. A printed circuit board adapted for prototyping comprising:

a processor module designed on a first portion of the printed circuit board, a second portion of the board being reserved for an input/output (I/O) module to be added at a later time;

a first connector that provides connection of the board to a primary bus of a computer system;

a bridge circuit that bridges the primary bus of the computer system to a secondary bus on the printed circuit board, the secondary bus providing a communication path between the processor module and the I/O module that is to be added at a later time; and a second connector coupled to the secondary bus to enable a separate I/O card to be connected to the printed circuit board and to serve temporarily as the I/O module of the board to permit prototyping of the processor module in the absence of an I/O module in said second portion of the board.

2. The printed circuit board of claim 1, wherein the processor module is intended to serve as a data router between the I/O module and the computer system.

3. The printed circuit board of claim 1, wherein said processor module comprises a Field Programmable Gate Array (FPGA) that implements program code to be executed by the processor module.

4. The printed circuit board of claim 1, wherein the primary bus of the computer system implements the Peripheral Component Interconnect (PCI) bus architecture, and wherein the first and second connectors, the secondary bus, and the bridge circuit are implemented in accordance with the PCI architecture.

5. The printed circuit board of claim 1, wherein said second connector comprises a straddle mount connector disposed on an upper edge of the card.

6. A method of prototyping an adapter card intended to have an I/O module in a second section of the card, a processor module in a first section of the card, and a first connector for connecting the adapter card to a primary bus of a computer system in which the card will be employed, the method comprising:

(a) providing on the adapter card being prototyped a bridge circuit in communication with the first connector of the adapter card to bridge the primary bus of the computer system to a secondary bus on the printed circuit board, the secondary bus adapted to provide a communication path between the processor module and the I/O module;

(b) providing on the adapter card a second connector in communication with the secondary bus to enable a separate I/O card to be connected to the adapter card and to serve temporarily as the I/O module of the card to permit prototyping of the processor module in the absence of an I/O module in the second section of the adapter card being prototyped;

(c) connecting a separate I/O card to said second connector, and (d) operating the adapter card being prototyped with the separate I/O card serving temporarily as the I/O module of the card to test the functionality of the card.

7. The method recited in claim 6, further comprising the steps of:

(e) removing the separate I/O module from said second connector when testing of the functionality of the adapter card is completed; and (f) implementing a permanent I/O module in the second section of the adapter card and removing the second connector from the card, the resulting adapter card comprising a production version of the card.

8. The method recited in claim 6, wherein steps (e) and (d) are repeated with other separate I/O cards to test the functionality of the adapter card with different I/O interface designs.

9. The method recited in claim 6, wherein the primary bus of the computer system implements the Peripheral Component Interconnect (PCI) bus architecture, and wherein the first and second connectors, the secondary bus, and the bridge circuit are implemented in accordance with the PCI architecture.

10. The method recited in claim 6, wherein said second connector comprises a straddle mount connector disposed on an upper edge of the card.

11. A method of prototyping an adapter card intended to have an I/O module in a second section of the card, a processor module in a first section of the card, and a first connector for connecting the adapter card to a primary bus of a computer system in which the card will be employed, the method comprising:

(a) providing on the adapter card being prototyped a bridge circuit in communication with the first connector of the adapter card to bridge the primary bus of the computer system to a secondary bus on the printed circuit board, the secondary bus adapted to provide a communication path between the processor module and the I/O module; and (b) providing on the adapter card a second connector in communication with the secondary PCI bus to enable a separate I/O card to be connected to the adapter card and to serve temporarily as the I/O module of the card to permit prototyping of the processor module in the absence of an I/O module in the second section of the adapter card being prototyped;

(c) connecting a separate I/O card to said second connector; and (d) operating the adapter card being prototyped with the separate I/O card serving temporarily as the I/O module of the card to test the functionality of the card; and (e) repeating steps (c) and (d) with other separate I/O cards to test the functionality of the adapter card with different I/O interface designs; and (f) determining which I/O interface design is preferred in the functionality of the adapter card; and (g) implementing a permanent I/O interface in the second portion of the adapter card.

* * * * *